Oct. 1, 1957 L. P. HAGEY 2,808,570
ULTRA HIGH FREQUENCY TUNER
Filed Dec. 8, 1953 2 Sheets-Sheet 1

Inventor
Lee P. Hagey
By Alois W. Graf
Attorney

Oct. 1, 1957 L. P. HAGEY 2,808,570

ULTRA HIGH FREQUENCY TUNER

Filed Dec. 8, 1953 2 Sheets-Sheet 2

Inventor
Lee P. Hagey
By Alois W. Graf
Attorney

United States Patent Office 2,808,570

Patented Oct. 1, 1957

2,808,570

ULTRA HIGH FREQUENCY TUNER

Lee P. Hagey, Buchanan, Mich., assignor to Electro-Voice, Incorporated, Buchanan, Mich.

Application December 8, 1953, Serial No. 396,879

5 Claims. (Cl. 333—33)

The present invention relates to an ultra high frequency tuner, and more particularly to a coupling arrangement between a relatively constant impedance transmission line and a tuned transmission line.

In fringe areas of television reception it is desired to augment the television receiver by a television booster. In designing boosters for very high frequency reception bands or channels, no particular problem of any serious nature was encountered in inserting between the 300 ohm impedance lead and the 300 ohm receiver lead a suitable amplifier of broad band characteristics. In the instance of ultra high frequency boosters, however, it has been found preferable to provide some tuning means for increased efficiency, and this presents a problem of providing proper coupling between the television receiver and the booster.

For optimum performance it would be desirable to connect a substantially constant impedance transmission line to a tuned transmission line by an impedance matching arrangement. Thus, if the booster is tuned, the connection between the receiver and the booster is moved or varied so as to maintain a substantially constant impedance value at the terminals of the transmission line leading to the television receiver. Where a tuned transmission line is employed, a pair of short circuited contacts move along the transmission line. The impedance of the tuned transmission line varies from zero at the short circuit point to a relatively high value at the open end of the line. At some intermediate point the optimum impedance value is found which most nearly matches or is suitable for connection to the constant impedance transmission line. In accordance with the present invention the tuning and the impedance matching operation are combined in a single manual control.

It, therefore, is an object of the invention to provide an improved ultra high frequency tuning device.

Still another object of the invention is to provide an improved ultra high frequency booster for television reception.

Another object of the invention is to provide an ultra high frequency coupling arrangement between a variable tuned circuit and a substantially constant impedance circuit.

A still further object of the invention is to provide an improved tuned circuit coupling arrangement between a tuned transmission line and a constant impedance transmission line.

Other and further objects of the present invention subsequently will become apparent by reference to the following description taken in conjunction with the accompanying drawing wherein.

Figure 1:
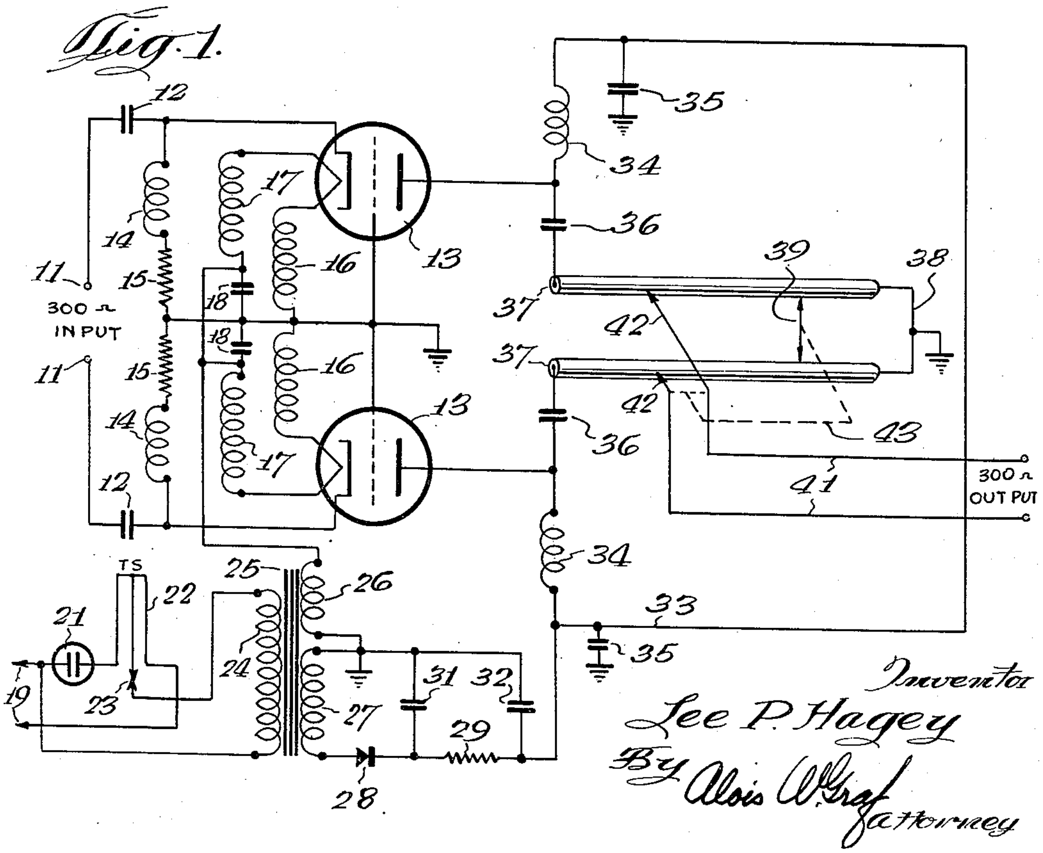
Figure 1 is a circuit diagram of an ultra high frequency circuit incorporating the teaching of the present invention.

Referring to Figure 1 of the drawing there are shown a pair of input terminals 11 connected to coupling capacitors 12, which are connected to the cathodes of a pair of vacuum tubes 13 and to one terminal of suitable inductors 14. The inductors 14 are each connected through a suitable resistor 15 to ground and to the grids of the vacuum tubes 13. One side of the filament for the heater of the cathode of each of the vacuum tubes 13 is connected through an inductor 16 to ground. Similarly suitable inductors 17 are connected from the other side of the filament of the vacuum tubes 13 to a connection leading to the source of potential. The terminals of the capacitors 17 are connected through by-pass coupling capacitors 18 to ground.

Suitable power for the vacuum tubes 13 and the associated circuits is provided by a circuit which is connected by a pair of terminals 19 to a suitable source of alternating current power. One side of the alternating current power 19 is connected to a female receptacle 21, the other side of which is connected to a thermal switch 22 connected in turn to the other side of the alternating current line 19. The television receiver plug is connected to the female receptacle 21. Whenever current is drawn from the television receiver, the thermal switch 22 is heated so as to close a pair of contacts 23, one of which is connected to one terminal of the primary winding 24 of a power transformer 25. The other terminal of the transformer winding 24 is connected to one side of the alternating current power source 19. The transformer 25 has a secondary winding 26 having one terminal grounded and the other terminal connected to the inductors 17. A high voltage secondary winding 27 is connected to ground and to a dry rectifier 28. Energy from the dry rectifier 28 is passed through a suitable filter circuit comprising a resistor 29 and a pair of filter capacitors 31 and 32. Anode energy from the filter circuit is supplied to a conductor 33 connected through suitable choke coils 34 to the anodes of the vacuum tubes 13. The conductor 33 adjacent the choke coils 34 is by-passed to ground by capacitors 35.

The anodes of the vacuum tubes 13 are connected through coupling capacitors 36 to a pair of bare conductors 37 arranged in parallel to form a transmission line which at the other end is connected by a conductor 38 to ground. In order to provide for tuning of the transmission line 37, a pair of shorted contacts 39 may be moved along the bare conductors 37. A substantially constant impedance transmission line 41, which generally has a 300 ohm impedance, is connected to the television receiver and to a pair of movable contacts 42. A suitable unitary control 43 is provided for moving the pairs of contacts 39 and 42. Since the impedance between the point of short circuit by the contacts 39 and the open ends of the transmission line 37 varies from zero to a particular value, dependent upon the Q of the circuit, some intermediate point engaged by the contacts 42 provides the optimum impedance relation with respect to the transmission line 41. The value of the line is such that the short circuiting contacts 39 and the movable contacts 42 must move at different rates in order to maintain a substantially constant impedance value at the output terminals 42. In the preferred embodiment this is accomplished by mounting the contacts 39 on a movable member 43 carrying a thread follower 44 which engages one thread of a threaded shaft 45 having two different threads thereon. The contacts 42 are mounted on a movable insulated member 46 carrying a thread follower 47 which engages the other thread on the control shaft 45. A suitable spring 48 is interposed between the members 43 and 46 to minimize backlash and to assist in spreading the members 43 and 46 when they travel in one of the directions along the transmission line 37.

Figure 2:
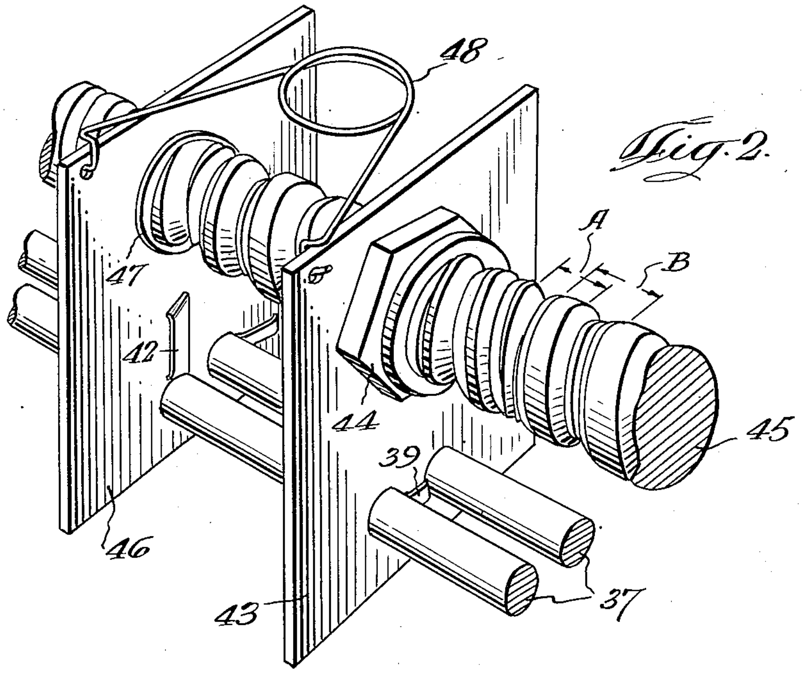
Figure 2 is a fragmentary perspective view showing certain essential mechanical details of a unitary control tuning element.

From Figure 2 it will be noted that the shaft 45 has two threads cut. One thread is indicated by the pitch distance A and another thread is indicated by the pitch distance B. In a particular embodiment the shaft 45 had a diameter of ⅜ of an inch, and the two threads were six and seven pitch, respectively. It will, of course, be appreciated that these values pertain only to a particular embodiment dependent upon the values of the transmission line 37, and that as the transmission line is changed other thread values would necessarily obtain.

Figure 3:
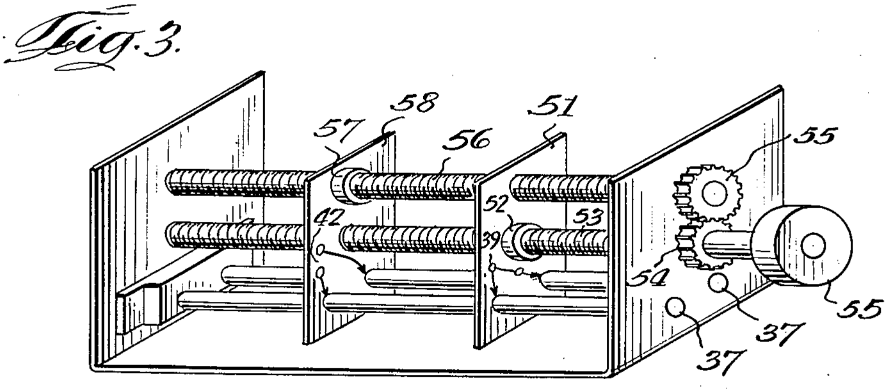
Figure 3 is a diagrammatic showing of an alternative mechanical arrangement for a unitary control tuning element.

While the arrangement in Figure 2 is the preferred embodiment for a unitary control of two movable contacts 39 and 42, other means of providing the unitary control are illustrated in Figure 3. Therein it will be noted that the transmission line conductors 37 are engaged by the contacts 39 mounted upon a movable member 51 having a thread follower in engagement with a threaded shaft 53 which is connected to a gear 54. The shaft 53 is provided with a suitable manual control knob 55. The gear 54 engages a gear 55 connected to a threaded shaft 56 which engages a thread follower 57 carried by a movable member 58 which carries the contacts 42. The threads on the shafts 53 and 56 may be of different pitch or may be of the same pitch. The gears 54 and 55 may have certain gear ratios so as to provide the proper relative speed of movement of the contacts 39 with respect to the movement of the contacts 42.

Figure 4:
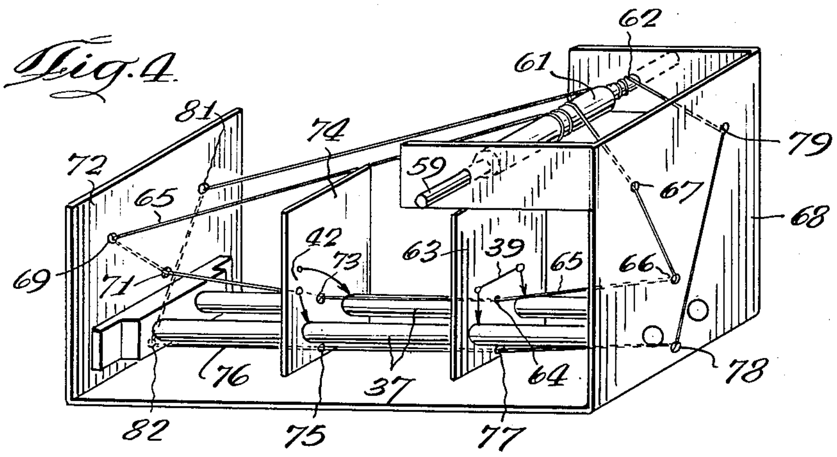
Figure 4 is another diagrammatic representation of still another mechanical arrangement for a unitary control tuning element.

Still another manner of executing the motion between the movable contacts 39 and 42 along a transmission line 37 is illustrated in Figure 4, wherein a control shaft 59 is provided with two drums of different diameter 61 and 62, respectively. The contacts 39 are carried by a movable member 63 which is connected at 64 to a cable or cord 65 which passes through suitable openings 66 and 67 in a bracket 68 and then is wrapped several times around the drum 61. The cord 65 is then passed through suitable openings 69 and 71 in a rear bracket 72 and passes through an opening 73 in a movable member 74 which carries the other contacts 42.

The movable member 74 carrying the contacts 42 is connected at 75 to a cable or cord 76 which passes through an opening 77 in the movable member 63 and then through openings 78 and 79 in the front bracket 68. The cord 76 is wrapped several times around the smaller drum 71 and then passes through suitable openings 81 and 82 in the rear bracket 72. Thus it will readily be seen that a rotation of the control shaft 54 will produce different rates of movement of the cables 65 and 76, thereby to impart different rates of motion to the movable plates 63 and 74 to accomplish the same action heretofore described in connection with Figures 2 and 3.

Figure 5:
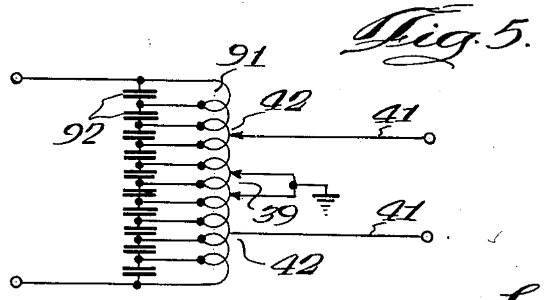
Figure 5 is a circuit diagram explanatory of the operation of the tuning device of the present invention.

Figure 5 is a circuit representation wherein an inductor 91 represents the inductance of the transmission line 37, and a plurality of capacitor 92 represent the distributed capacitance along the line 37. The contacts 39 along the inductor 91 represent the short circuit elements of the transmission line which are connected to the constant impedance circuit or transmission line 41. As the contacts 39 are effectively moved further apart, the contacts 42 likewise must be moved further apart but at a different rate so that the impedance value at the contacts 42 remains substantially the same so as to provide a matching to the line 41. It will readily be appreciated to those skilled in the art that such an arrangement constitutes the familiar method of tapping down for impedance matching on a coil.

While for the purpose of illustrating and describing the present invention certain preferred embodiments have been shown in the drawing, it is to be understood that the invention is not to be limited thereby since such variations are contemplated as may be commensurate with the spirit and scope of the claims. It furthermore will be appreciated that while the tuning arrangement has been shown in connection with an ultra high frequency television booster, that the tuning device is susceptible of employment in other ultra high frequency amplifiers and circuits.

I claim as my invention:

1. An ultra high frequency tuner comprising a transmission line, a control shaft having a plurality of threads of different pitch, a thread follower for each thread pitch mounted on said shaft, a pair of contacts carried by one follower short circuiting said transmission line for tuning said line, and a second pair of contacts carried by another follower for contacting intermediate points on said transmission line having a fixed impedance value.

2. An ultra high frequency tuner comprising a transmission line, a control shaft having a plurality of threads of different pitch coextensive along said shaft, a thread follower for each thread pitch mounted on said shaft, a pair of contacts carried by each follower, said contacts being in engagement with different portions of said transmission line, one of said pair of contacts being connected to short said transmission line to establish one end of said line, said other pair of contacts providing transmission line take-off points having a constant impedance value.

3. The combination comprising an ultra high frequency tuner having a tunable circuit including a bare transmission line, a pair of contacts in engagement with said line and arranged to be moved therealong to tune said circuit, a constant impedance transmission line, a second pair of movable contacts connected to said latter line and in engagement with said first transmission line, and a single manual control means for moving both pairs of contacts at different rates of travel to maintain a constant impedance at said latter pair of contacts.

4. The combination comprising an ultra high frequency tuning circuit including a bare transmission line, a pair of contacts in engagement with said line and arranged to be moved therealong to tune said circuit, a constant impedance circuit, a second pair of contacts connected to said latter circuit and in engagement with said transmission line, and a single manual control means for moving both pairs of contacts at different rates of travel along said line to maintain a predetermined impedance ratio between said two pairs of contacts.

5. An ultra high frequency tuning circuit, a transmission line, a control shaft having a plurality of threads of different pitch coextensive along said shaft, a thread follower for each thread pitch mounted on said shaft, a pair of contacts carried by one follower for short circuiting said transmission line, and a second pair of contacts carried by another follower for connecting a substantially constant impedance to an intermediate point on said first transmission line.

References Cited in the file of this patent

UNITED STATES PATENTS

| | | |
|---|---|---|
| 2,233,763 | Ayer | Mar. 4, 1941 |
| 2,397,787 | Gubin | Apr. 2, 1946 |
| 2,473,310 | Strutt et al. | June 14, 1949 |
| 2,647,947 | Downey | Aug. 4, 1953 |